Feb. 16, 1960 A. A. MACDONALD 2,925,561

CRYSTAL OSCILLATOR SYSTEM

Filed July 1, 1955 2 Sheets-Sheet 1

INVENTOR.
Angus A. Macdonald
BY Mueller & Aichele
Attys.

INVENTOR.
Angus A. Macdonald
BY Mueller & Aichele
Attys.

United States Patent Office 2,925,561

Patented Feb. 16, 1960

2,925,561

CRYSTAL OSCILLATOR SYSTEM

Angus A. Macdonald, Hinsdale, Ill., assignor to Motorola, Inc., Chicago, Ill., a corporation of Illinois Application July 1, 1955, Serial No. 519,391

16 Claims. (Cl. 332—26)

This invention relates generally to frequency modulation systems and more particularly to a crystal controlled oscillator circuit the frequency of which can be varied in accordance with a modulating or control signal.

In order to hold the waves from radio transmitters within defined channels very precise control of the frequency transmitted is required. To accomplish this it has been customary to use crystal controlled oscillators which provide a highly constant frequency in the presence of widely varying conditions, such as changes in temperature and supply voltage. Because the crystals provide close control of frequency, to provide frequency modulation of such a crystal controlled oscillator has been difficult to accomplish. For this reason frequency modulation has been provided in most cases by operating a crystal controlled oscillator at fixed frequency and applying the oscillations therefrom to a phase shifting device which modulates the phase of the oscillations. By the use of suitable corrective networks such phase modulated oscillations have generally the same characteristics as frequency modulation and these waves are transmitted to thereby transmit the modulating signal. However, since a separate modulator is required in addition to the oscillator, the overall equipment becomes relatively complicated and expensive.

It is also desirable to provide relatively slow control of the frequency of crystal controlled oscillators such as for automatic frequency control of a local oscillator of a receiver. Although circuits providing such control have been used they have been objectionably complicated.

It is therefore an object of the present invention to provide an improved crystal controlled oscillator the frequency of which can be directly varied by a modulating or control signal.

A further object of the invention is to provide an extremely simple modulated crystal oscillator circuit which is highly stable at a center frequency and which permits wide deviation in response to modulating signals.

Another object of the invention is to provide a simple crystal oscillator wherein variations in the frequency of the oscillator are provided by variations in the value of a circuit element of the oscillator.

A feature of the invention is the provision of a crystal oscillator having only a single electron device which may be directly frequency modulated.

A further feature of the invention is the provision of an oscillator having a crystal operating at the series mode in the feedback circuit and with a series resonant circuit connected in series with the crystal having at least one component thereof variable to vary the phase through the feedback circuit and thereby vary the oscillator frequency.

Another feature of the invention is the provision of a crystal oscillator having a neutralized crystal in the feedback path and a series resonant circuit including a saturable reactor in series with the crystal for controlling the phase shift of the feedback path and thereby changing the frequency of the oscillator. The oscillator may be of the tuned grid-tuned plate type having feedback from the plate to the grid, or of the Colpitts type having feedback from the cathode to the grid.

Still another feature of the invention is the provision of a crystal oscillator the frequency of which is controlled by a feedback circuit including a crystal and a series resonant circuit in series with the crystal, with the series resonant circuit including a condenser and an inductor, and with the condenser and/or the inductor being bridged by a rectifier which is selectively rendered conducting by a modulating signal to thereby change the effective value of the condenser and/or the inductor to change the phase shift in the feedback circuit and thereby change the frequency of the oscillator. It will be apparent that a voltage sensitive capacitor or any capacitor or inductor element capable of being varied by a control signal can be used in the circuit.

Further objects, features and the attending advantages of the invention will be apparent from a consideration of the following description when taken in connection with the accompanying drawings in which Fig. 1 illustrates a crystal oscillator in accordance with the invention including a saturable reactor modulating element;

In practicing the invention there is provided an electron oscillator including a crystal operating in a series resonant mode in the feedback circuit. An inductor may be bridged across the crystal to neutralize the holder and shunt crystal capacity, and a resistor may be arranged thereacross to damp out parasitic oscillations. Connected in series with the crystal is a series resonant circuit which is resonant at the oscillator frequency. The series resonant circuit includes at least one element which may be effectively varied in value to change the tuning of the series resonant circuit and thereby change the phase shift through the feedback path. This in turn changes the frequency of oscillation. The oscillator may be of the feedback type having tuned grid and plate circuits with the feedback being applied from the plate to the grid. Alternatively, the oscillator may be of the Colpitts type with feedback provided from the cathode to the tuned circuit which is connected to the grid. Variation of the resonant circuit may be provided by the use of a saturable reactor as the inductor thereof with a modulating current being applied to the saturable reactor to change the inductance thereof. Alternatively, modulation may be provided by using a condenser and an inductor as a series resonant circuit in series with the crystal, with the condenser and/or the inductor being bridged by a rectifier to which modulating signals are applied to render the same selectively conducting and thereby effectively change the values of the condenser and inductor and the tuning of the feedback circuit. Also, a voltage sensitive capacitor can be used as the frequency controlling element. In addition to its use as a frequency modulator, such a system can also be used to provide a slow frequency control effect such as for automatic frequency control of a radio receiver or the like.

Figure 1:
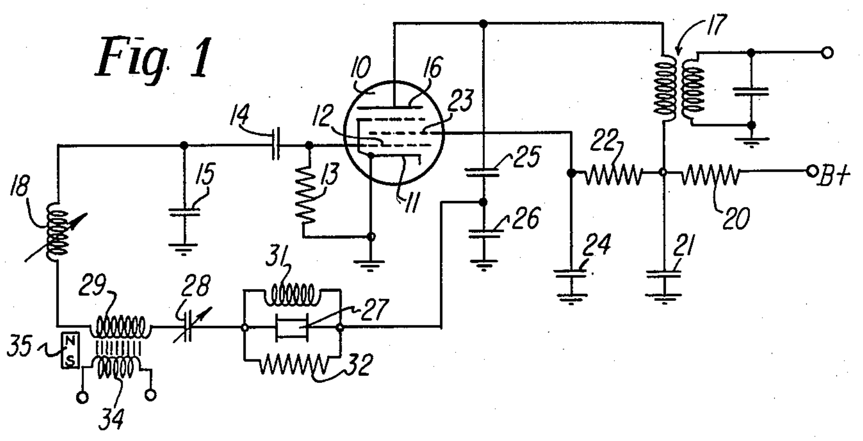

Referring now to the drawings, in Fig. 1 there is illustrated an oscillator circuit including a pentode tube 10. The cathode 11 of the pentode is connected to ground and the control grid 12 is biased by resistor 13. Condenser 15 and inductor 18 form a grid tank circuit which is coupled to the grid 12 through condenser 14. The anode 16 of the pentode is connected to a tuned output circuit 17. Both the grid tank circuit and the output circuit are tuned to the desired operating frequency. Operating potential is applied from a B plus source through resistor 20 and the tuned circuit 17 to the anode 16, being bypassed by condenser 21. B plus potential is also applied through resistor 22 to the screen grid 23 of the tube, with the screen grid being bypassed by condenser 24.

The oscillator of Fig. 1 includes a regenerative feedback circuit connected to the anode 16 by condensers 25 and 26. The feedback circuit is a series circuit including crystal 27, condenser 28, and saturable reactor 29 which is connected to inductor 18, so that the circuit is effectively connected between the plate and grid of the tube 10. The crystal 27 is neutralized by shunt inductor 31 to prevent operation at nearby anti resonant modes. A resistor 32 is also bridged across the crystal 27 to damp out parasitic oscillations.

The saturable reactor 30 includes an energizing winding 34 to which modulating potentials may be applied. Permanent magnet 35 may be provided for biasing the field of the saturable reactor so that opposite cycles of the waves applied to the winding 34 are effective to control the inductance of the saturable reactor in opposite senses.

The crystal 27 is cut so that the series resonance response thereof is at the center frequency of the oscillator. As previously stated the crystal is neutralized to prevent operation at undesired modes. Connected in series with the crystal 27 is the series resonant circuit including condenser 28 and saturable reactor 29 which is also tuned to the oscillator frequency. Accordingly, the feedback circuit has a low impedance at the oscillator center frequency, and a higher impedance as the frequency deviates from the center frequency. As the inductance of the saturable reactor changes in response to the modulating wave applied thereto, the series resonant circuit will be detuned and will produce a phase shift in the oscillator feedback circuit. In order for oscillations to take place, the phase shift in the entire feedback circuit must be returned to zero. This is accomplished by a shift of the oscillating frequency which produces a phase shift in the crystal which is equal and opposite to the phase shift produced in the series resonant circuit. Accordingly, change of the inductance of the saturable reactor will change the oscillator frequency.

One highly desirable characteristic of the oscillator in accordance with the invention is that the modulating process which produces frequency modulation does not produce attending amplitude modulation as in many systems. This results because the grid and plate circuits of the oscillator may have relatively low Q so that in effect the stage is a wide band amplifier with feedback. Accordingly, the gain of the amplifier does not change materially with frequency. However, for oscillations to occur the phase shift of the feedback path must be exactly zero and therefore the feedback path forms the frequency determining element of the oscillator. Accordingly, the feedback path of the oscillator must be at series resonance and this is accomplished in the present circuit by operating the crystal at series resonance and by providing a circuit in series therewith which is also series resonant. The resistance of the feedback path will be determined by the Q of the crystal and the series resonant circuit. This also will tend to remain constant to further hold the amplitude of the oscillator constant. Because amplitude modulation is not produced by frequency modulation of the oscillator, limiters normally required following frequency modulation stages may be eliminated or may be simplified because of the decrease of amplitude variations.

Figure 2:
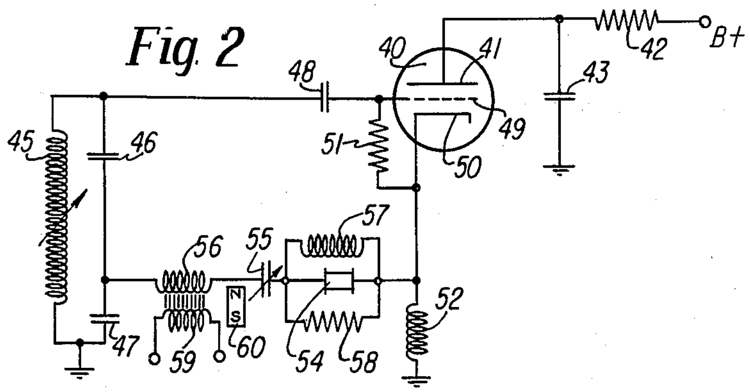
Fig. 2 illustrates a simplified circuit in accordance with the invention.

Fig. 2 shows a somewhat different oscillator circuit which is extremely simple and requires only a triode valve. The valve 40 includes a plate 41 connected to an untuned circuit. Operating potential is applied through resistor 42, with the plate being bypassed by condenser 43. The oscillator is basically of the Colpitts type including an inductor 45 bridged by series condensers 46 and 47 forming a tuned circuit. The tuned circuit is connected through condenser 48 to the grid 49 of the triode, with the grid being returned to the cathode 50 of the triode through resistor 51. The cathode is grounded through choke 52. Regenerative feedback is provided from the cathode through the circuit including crystal 54, condenser 55 and saturable reactor 56. As in Fig. 1, the crystal is neutralized by inductor 57 to prevent undesired modes, and resistor 58 damps out undesired oscillations. The saturable reactor 56 may be of the same construction as shown in Fig. 1 with modulating signals being applied to the winding 59 and the permanent magnet 60 providing bias so that full wave operation is provided.

The operation of the circuit of Fig. 2 is generally similar to that of Fig. 1 with the crystal and the resonant circuit controlling the frequency of the oscillator through control of the phase shift in the feedback circuit. A highly accurate center frequency is provided and wide deviation is produced in response to the modulating signal. As previously stated the amplitude will remain substantially constant in the presence of frequency variations.

Figure 3:
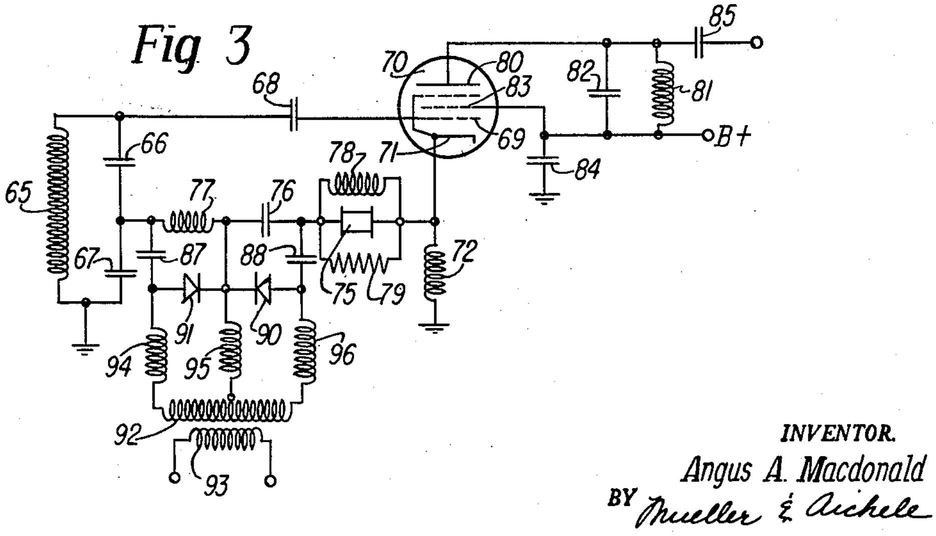
Fig. 3 illustrates a circuit utilizing a condenser and an inductor in the series resonant feedback circuit with rectifiers controlling the effectiveness thereof.

In Fig. 3 there is illustrated a further circuit arrangement in accordance with the invention. This circuit is generally like the circuit of Fig. 2, but uses a different modulating element. The oscillator includes a tuned grid circuit formed by inductor 65 and condenser 66 and 67 connected in series thereacross. The tuned circuit is coupled through condenser 68 to the control grid 69 of the pentode 70. The cathode 71 is grounded through choke 72 which provides cathode bias.

A regenerative feedback circuit is provided from the cathode 71 including crystal 75, condenser 76 and inductor 77 connected to the common terminal between condensers 66 and 67. Inductor 78 is bridged across crystal 75 to neutralize the capacity of the holder, and resistor 79 is also bridged across the crystal to damp out undesired oscillations. Operating potential is applied to the plate 80 through the tuned circuit including inductor 81 connected in parallel with condenser 82. Operating potential is also applied to the screen grid 83 which is bypassed by condenser 84.

Considering now the operation of the oscillator, it will be noted that rectifiers 90 and 91 respectively are connected across the condenser 76 and inductor 77. Condensers 87 and 88 block direct current. The rectifiers are connected to the secondary winding 92 of the modulation transformer 93 by chokes 94, 95 and 96. Accordingly, as modulation signals are applied to the transformer 93, voltage is developed in the secondary winding 92 which will render the diode 90 conductive during the portion of the cycle of one polarity and will render the diode 91 conducting during the portion of the cycle of opposite polarity. The rectifiers are effective to partially short out the condenser 76 and inductor 77 to thereby change the effective values thereof and the tuning of the feedback path. Condenser 76 and inductor 77 are of such values to resonate at the oscillator frequency so that when the values are changed phase shifts will be produced which will change the tuning of the oscillator. Since the condenser will be at least partially shorted during one-half cycle and the inductor during the other half cycle the effect will cause a balanced frequency deviation of the oscillator circuit. This therefore has generally the same effect as the saturable reactor wherein the inductance is increased and decreased by the alternate half cycles to shift the frequency of the oscillator in both directions from the center frequency thereof.

Figures 4, 5:
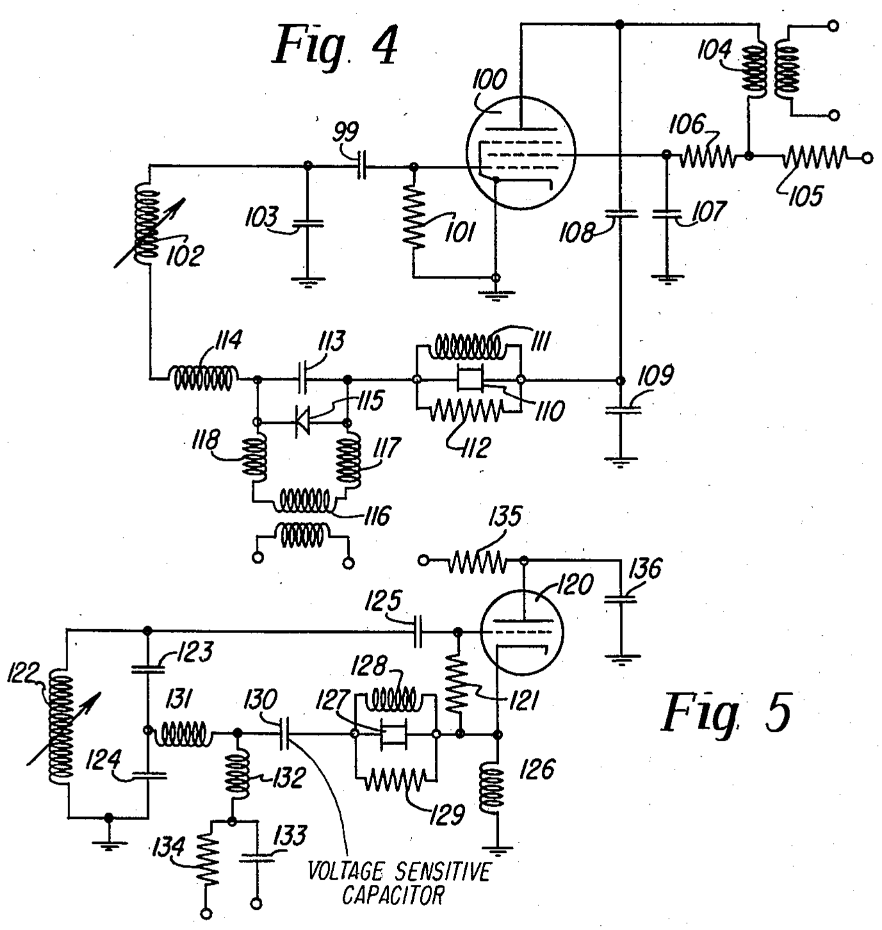
Fig. 4 shows a circuit similar to Fig. 3 wherein only the capacitor is controlled by a rectifier.
Fig. 5 shows a crystal oscillator with a voltage sensitive capacitor to control the frequency.

It will be obvious that in the system of Fig. 3 modulation of the oscillation frequency may be produced by effectively shorting out either the condenser 76 or the inductor 77, and that it is not necessary to vary the effective value of both. Fig. 4 illustrates a system wherein only the effective value of the condenser is varied. The circuit of Fig. 4 is generally similar to that of Fig. 1 with a pentode tube 100 having the grid thereof biased with respect to the cathode by resistor 101. The grid tank circuit is formed by inductor 102 and condenser 103, and is coupled to the grid through condenser 99. The plate of the tube 100 is connected to an output circuit including transformer 104. B plus potential is applied through resistors 105 and 106 to the screen grid of the tube, being bypassed by condenser 107. Plate potential is also applied through resistor 105 and the primary winding of the transformer 104 to the plate of tube 100.

A feedback circuit is provided for the oscillator including condensers 108 and 109 connected to the plate of the tube 100, crystal 110 and the series resonant circuit formed by condenser 113 and inductor 114. The crystal 110 is neutralized by inductor 111 and damped by resistor 112. The condenser 113 is bridged by rectifier 115, the conductivity of which is controlled by a control voltage applied through transformer 116 and coupled to the diode 115 through chokes 117 and 118.

It is to be pointed out that the system of Fig. 4 will not provide balanced modulation since only the effective value of the condenser 113 may be changed. This, however, is satisfactory in many applications such as for automatic frequency control in a superheterodyne receiver. The system is relatively simple requiring only a single diode and a transformer for applying modulating signals thereto.

In Fig. 5 there is shown a still further embodiment which is generally like the circuit of Fig. 2. The triode tube 120 is connected in a Colpitts type circuit. The grid is returned to the cathode by resistor 121 and is tuned by the circuit including inductor 122 and condensers 123 and 124, which is coupled to the grid through condenser 125. The cathode is grounded through choke 126, and the feedback circuit is connected from the cathode to the junction between condensers 113 and 114. The feedback circuit includes crystal 127 which is neutralized by conductor 128 and damped by resistor 129, and a series resonant circuit in series therewith including condenser 130 and inductor 131.

The condenser 130 may be a voltage sensitive capacitor the value of which changes with the potential developed thereacross. For controlling the potential across the condenser, a choke 132 is provided to which a modulating signal may be applied through condenser 133, and to which a bias may be applied through resistor 134. A resistor may also be used instead of the choke 132. The other side of the condenser 130 is returned to ground through inductors 128 and 126 so that the bias and modulating potential are effective to control the voltage across the voltage sensitive condenser 130. By providing the proper direct current bias the modulating voltage will cause phase shifts varying in both directions to thereby provide a balanced change in the frequency of the oscillator.

In order to provide the best frequency control of the oscillator by the crystal it has been found that certain basic requirements must be met. First the crystal must operate in a series resonant mode and must be placed in the feedback path of the oscillator. In most cases it is preferable that the feedback path through the crystal be the only feedback path of the oscillator. Secondly, the crystal must be operated at low energy levels at which the characteristics are linear and the crystal is not affected by heating and mechanical effects. Another requirement is that the oscillator circuit be arranged so that the incidental phase shifts therein are held to a minimum. This is necessary in order that the phase shifts resulting from modulation will be most effective. Another requirement is that the feedback network is not subject to variable loading due to changes in the operating level of the oscillator. The oscillator circuits described meet these requirements.

The oscillator circuit is particularly desirable for use as a modulator in a transmitter, but it is obvious that it may also be used in other systems. The circuit is highly satisfactory for use in a superheterodyne receiver as the local oscillator, and the circuit may be controlled by an automatic frequency control voltage to shift the frequency as may be required to compensate for inaccuracies of tuning. Various frequency controlling elements, that is saturable reactors, voltage sensitive capacitors, or rectifier frequency control elements may be used for shifting the center frequency of an oscillator as may be most effective in a particular application.

The frequency modulated oscillator in accordance with the invention makes it possible to greatly simplify frequency modulation transmitters since the separate modulator usually required is eliminated. Accordingly the number of tubes or other electron devices is materially reduced. The system provides stable constant amplitude operation with sufficiently wide deviation and has been found to be highly satisfactory for many uses.

I claim:

1. An electronic oscillator including in combination, an electron device having input and output electrodes, said device providing amplified signals at said output electrode in response to the application of signals to said input electrode, input and output circuits connected respectively to said input and output electrodes with one of said circuits being resonant at a predetermined frequency, and a feedback circuit coupling said output circuit to said input circuit for controlling the frequency of the oscillator by control of the phase of signals fed back, said feedback circuit including a piezoelectric crystal unit series resonant at said predetermined frequency and a saturable reactor having a control winding and an inductance portion with the inductance of said inductance portion varying in accordance with a signal applied to said control winding, said feedback circuit having a series resonant portion in series with said crystal unit including said inductance portion and being tunable thereby through a range of frequencies including said predetermined frequency to thereby vary the phase of signals fed back, said input and output circuits and said feedback circuit being constructed so that the frequency of oscillations is controlled substantially entirely by said feedback circuit and the amplitude of oscillations remains substantially constant, whereby the frequency of said oscillator varies from said predetermined frequency in response to the signal applied to said saturable reactor.

2. An electronic oscillator including in combination, an electron device having input and output electrodes, said device providing amplified signals at said output electrode in response to the application of signals to said input electrode, input and output circuits connected respectively to said input and output electrodes, and a feedback circuit coupling said output circuit to said input circuit for controlling the frequency of the oscillator by feeding back signals of a predetermined frequency and controlling the phase thereof, said feedback circuit including a piezoelectric crystal unit series resonant at said predetermined frequency and a series resonant circuit connected in series with said crystal unit, said series resonant circuit including condenser means and saturable reactor means having an inductance portion connected in series with said condenser means, said saturable reactor means having a control portion for varying the inductance of said inductance portion in accordance with the signals applied to said control portion, said series resonant circuit being tunable by said saturable reactor means through a range of frequencies including said predetermined frequency to thereby vary the phase of signals fed back, said input and output circuits and said feedback circuit being constructed so that the frequency of oscillations is controlled substantially entirely by said feedback circuit, whereby the frequency of said oscillator varies from said predetermined frequency over a range of frequencies in response to the signal applied to said saturable reactor means.

3. A frequency modulated oscillator including in combination, an electron device having input and output electrodes, said device providing amplified signals at said output electrode in response to the application of signals to said input electrode, an output circuit connected to said output electrode resonant at a predetermined frequency, a feedback circuit connecting said output electrode to said input electrode for controlling the frequency of the oscillator by control of the phase of signals fed back, said feedback circuit including a piezoelectric crystal unit series resonant at said predetermined frequency, a saturable reactor having a control winding and an inductance portion with the inductance of said inductance portion varying in accordance with a modulating signal applied to said control winding, said feedback circuit having a series resonant portion in series with said crystal unit including said inductance portion and being tunable thereby through a range of frequencies including said predetermined frequency to thereby vary the phase of signals fed back, said output circuit and said feedback circuit being constructed so that the frequency of oscillations is controlled substantially entirely by said feedback circuit, and means applying a modulating signal to said control winding whereby the frequency of said oscillator is modulated to provide frequency deviation suitable for frequency deviation suitable for frequency modulation transmission in response to the modulating signal applied to said saturable reactor.

4. A frequency modulated oscillator including in combination, an electron device having input and output electrodes, said device providing amplified signals at said output electrode in response to the application of signals to said input electrode, input and output circuits connected respectively to said input and output electrodes with one of said circuits being resonant at a predetermined frequency, a feedback circuit coupling said output circuit to said input circuit for controlling the frequency of the oscillator by control of the phase of signals fed back, said feedback circuit including a piezoelectric crystal unit series resonant at said predetermined frequency, and saturable reactor means having a control winding and an inductance portion with the inductance of said inductance portion varying in accordance with a modulating signal applied to said control winding, said saturable reactor means having a permanent magnet portion providing a bias for the modulating signal, said feedback circuit having a series resonant portion in series with said crystal unit including said inductance portion and being tunable thereby through a range of frequencies including said predetermined frequency to thereby vary the phase of signals fed back, said output circuit and said feedback circuit being constructed so that the frequency of oscillations is controlled substantially entirely by said feedback circuit, and means applying a modulating signal to said control portion whereby the frequency of said oscillator is modulated to provide deviation of the oscillator frequency suitable for frequency modulation transmission in response to the modulating signal applied to said control winding.

5. A frequency modulated oscillator including in combination, an electron device having input and output electrodes, said device providing amplified signals at said output electrode in response to the application of signals to said input electrode, an output circuit connected to said output electrode, and a feedback circuit connecting said output electrode to said input electrode for controlling the frequency of the oscillator by feeding back signals of a predetermined frequency and controlling the phase thereof, said feedback circuit including a piezoelectric crystal unit series resonant at said predetermined frequency and a series resonant circuit connected in series with said crystal unit, said series resonant circuit including condenser means and saturable reactor means having an inductance portion connected in series with said condenser means, said saturable reactor means having a control portion for varying the inductance of said inductance portion in accordance with the modulating signals applied to said control portion, said series resonant circuit being tunable by said saturable reactor means through a range of frequencies including said predetermined frequency to thereby vary the phase of signals fed back, said input and output circuits and said feedback circuit being constructed so that the frequency of oscillations is controlled substantially entirely by said feedback circuit, and means applying a modulating signal to said control winding whereby the frequency of said oscillator is modulated to provide deviation of the oscillator frequency suitable for frequency modulation transmission in response to the modulating signal applied to said saturable reactor means.

6. A frequency modulated oscillator including in combination a three electrode electron device having an input electrode, an output electrode, and a common electrode, said device providing amplified signals at said output electrode in response to the application of signals to said input electrode, an input circuit connected to said input electrode tuned to a predetermined frequency, and a feedback circuit connecting said common electrode to said input circuit for controlling the frequency of the oscillator by feeding back signals of a predetermined frequency and controlling the phase thereof, said feedback circuit including a piezoelectric crystal unit series resonant at said predetermined frequency and a series resonant circuit connected in series with said crystal unit, said series resonant circuit including condenser means and saturable reactor means having an inductance portion connected in series with said condenser means, said saturable reactor means having a control portion for varying the inductance of said inductance portion in accordance with the modulating signals applied to said control portion, said series resonant circuit being tunable by said saturable reactor means through a range of frequencies including said predetermined frequency to thereby vary the phase of signals fed back, said input circuit and said feedback circuit being constructed so that the frequency of oscillations is controlled substantially entirely by said feedback circuit, and means applying a modulating signal to said control portion whereby the frequency of said oscillator varies from said predetermined frequency to provide deviation of the oscillator frequency suitable for frequency modulation transmission in response to the signal applied to said saturable reactor means.

7. An electronic oscillator including in combination, an electron device having input and output electrodes, said device providing amplified signals at said output electrode in response to the application of signals to said input electrode, input and output circuits connected respectively to said input and output electrodes, a feedback circuit coupling said output circuit to said input circuit for controlling the frequency of the oscillator by feeding back signals of a predetermined frequency and controlling the phase thereof, said feedback circuit including a piezoelectric crystal unit series resonant at said predetermined frequency and a series resonant circuit connected in series with said crystal, said series resonant circuit including condenser means and inductor means connected in series with each other, and control means including first and second rectifier means bridged respectively across said condenser means and said inductor means, and modulating means responsive to control signals coupled to said control means for selectively rendering said rectifier means conducting to thereby change the effective values of said condenser means and said inductor means, said series resonant circuit being tunable by changing the effective values of said condenser means and said inductor means through a range of frequencies including said predetermined frequency to thereby vary the phase of signal fed back, said input and output circuits and said feedback circuit being constructed so that the frequency of oscillations is controlled substantially entirely by said feedback circuit, whereby the frequency of said oscillator varies from said predetermined frequency to provide deviation of the oscillator frequency suitable for frequency modulation transmission in response to the signal applied to said modulating means.

8. A frequency modulated oscillator including in combination, an electron device having an input electrode, an output electrode and a common electrode, said device providing amplified signals at said output electrode in response to the application of signals to said input electrode, an input circuit connected to said input electrode and tuned to a predetermined frequency, a feedback circuit connecting said common electrode to said input circuit for controlling the frequency of the oscillator by feeding back signals of a predetermined frequency and controlling the phase thereof, said feedback circuit including a piezoelectric crystal unit series resonant at said predetermined frequency and a series resonant circuit connected in series with said crystal, said series resonant circuit including condenser means and inductor means connected in series with each other, and control means including first and second rectifier means bridged respectively across said condenser means and said inductor means, and modulating means responsive to modulating signals coupled to said control means for selectively rendering said rectifier means conducting to thereby change the effective values of said condenser means and said inductor means, said series resonant circuit being tunable through a range of frequencies including said predetermined frequency by changing the effective values of said condenser means and said inductor means to thereby vary the phase of signals fed back, said input circuit and said feedback circuit being constructed so that the frequency of oscillations is controlled substantially entirely by said feedback circuit, whereby the frequency of said oscillator is modulated to provide deviation of the oscillator frequency suitable for frequency modulation transmission in response to the modulating signals applied to said modulating means.

9. An electronic oscillator including in combination, an electron discharge device having input and output electrodes, input and output circuits connected respectively to said input and output electrodes, a regenerative feedback circuit coupling said output circuit to said input circuit for controlling the frequency of the oscillator by controlling the frequency and phase of signals fed back, said feedback circuit including a piezoelectric crystal unit series resonant at said predetermined frequency and a series resonant circuit connected in series with said crystal unit, said series resonant circuit including reactor means, and control means including rectifier means bridged across said reactor means, said control means including means responsive to control signals for selectively rendering said rectifier means conducting to thereby change the effective value of said reactor means, said series resonant circuit being tunable through a range of frequencies including said predetermined frequency by changing the effective value of said reactor means to thereby vary the phase of signals fed back, said input and output circuits and said regenerative feedback circuit being constructed so that the frequency of oscillations is determined substantially entirely by said feedback circuit, whereby the frequency of said oscillator is controlled in response to the control signals applied to said control means.

10. A frequency modulated oscillator including in combination, an electron discharge device having input and output electrodes, input and output circuits connected respectively to said input and output electrodes, a regenerative feedback circuit coupling said output circuit to said input circuit for controlling the frequency of the oscillator by controlling the frequency and phase of signals fed back, said feedback circuit including a piezoelectric crystal unit series resonant at said predetermined frequency and a series resonant circuit connected in series with said crystal unit, said series resonant circuit including reactor means, and control means including rectifier means bridged across said reactor means and means responsive to modulating signals for selectively rendering said rectifier means conducting to thereby change the effective value of said reactor means, said series resonant circuit being tunable through a range of frequencies including said predetermined frequency by changing the effective value of said reactor means to thereby vary the phase of signals fed back, said input and output circuits and said regenerative feedback circuit being constructed so that the frequency of oscillations is determined substantially entirely by said feedback circuit, whereby the frequency of said oscillator is modulated in response to the modulating signals applied to said control means.

11. An electronic oscillator including in combination, an electron device having input and output electrodes, said device providing amplified signals at said output electrode in response to the application of signals to said input electrode, input and output circuits connected respectively to said input and output electrodes, and a feedback circuit coupling said output circuit to said input circuit for controlling the frequency of the oscillator by controlling the frequency and phase of signals fed back, said feedback circuit including a piezoelectric crystal unit series resonant at a predetermined frequency and a series resonant circuit connected in series with said crystal unit, said series resonant circuit including inductor means and voltage sensitive capacitor means connected in series with said inductor means, and means for applying a control voltage to said voltage sensitive capacitor means for varying the capacity thereof to thereby vary the phase of signals fed back, said input and output circuits and said regenerative feedback circuit being constructed so that the frequency of oscillations is determined substantially entirely by said feedback circuit, whereby the frequency of said oscillator varies from said predetermined frequency in response to the voltage applied to said voltage sensitive capacitor means.

12. A frequency modulated oscillator including in combination, an electron device having input and output electrodes, said device providing amplified signals at said output electrode in response to the application of signals to said input electrode, circuit means connected to said input and output electrodes and including a regenerative feedback circuit coupling said output electrode to said input electrode for controlling the frequency of the oscillator by controlling the phase of signals fed back, said feedback circuit including a piezoelectric crystal unit series resonant at a predetermined frequency and a series resonant circuit connected in series with said crystal unit, said series resonant circuit including voltage sensitive capacitor means and means for applying a modulating signal to said voltage sensitive capacitor means for varying the capacity thereof, said series resonant circuit being tunable through a range of frequencies including said predetermined frequency by changing the capacity of said voltage sensitive capacitor means to thereby vary the phase of signals fed back, said circuit means and said regenerative feedback circuit being constructed so that the frequency of oscillations is determined substantially entirely by said feedback circuit, whereby the frequency of said oscillator is modulated in response to the modulating signal applied to said voltage sensitive capacitor means.

13. A frequency modulated oscillator including in combination, an electron device having input and output electrodes, said device providing amplified signals at said output electrode in response to the application of signals to said input electrode, circuit means connected to said input and output electrodes and including a regenerative feedback circuit coupling said output electrode to said input electrode, said feedback circuit including a crystal which is series resonant at a predetermined frequency and a series resonant circuit connected in series with said crystal, reactance means having a reactance portion and signal control means for controlling the effective value of said reactance portion in accordance with a signal applied to said signal control means, said reactance portion being connected in said series resonant circuit for tuning the same through a range of frequencies including said predetermined frequency, and means for applying modulating signals to said signal control means to thereby cause the frequency of said oscillator to vary from said predetermined frequency over a frequency range which provides the deviation required for frequency modulation transmission, said circuit means and said feedback circuit being constructed so that the frequency of oscillation is determined substantially entirely by said feedback circuit and the amplitude of oscillations is substantially constant over the frequency range.

14. A frequency modulated oscillator including in combination, an electron device having input and output electrodes, said device providing amplified signals at said output electrode in response to the application of signals to said input electrode, input and output circuits connected respectively to said input and output electrodes with one of said circuits being resonant at a predetermined frequency, a feedback circuit coupling said output circuit to said input circuit, said feedback circuit including a crystal which is series resonant at the predetermined frequency and a series resonant circuit connected in series with said crystal, reactance means having a reactance portion and a signal control portion for controlling the effective value of said reactance portion in accordance with a signal applied to said signal control portion, said reactance portion being connected in said series resonant circuit for tuning the same through a range of frequencies including said predetermined frequency, and means for applying modulating signals to said signal control portion to thereby cause the frequency of said oscillator to vary from said predetermined frequency over a frequency range which provides the deviation required for frequency modulation transmission, said input and output circuits and said feedback circuit being constructed so that the frequency of oscillation is determined substantially entirely by said feedback circuit.

15. An electronic oscillator including in combination, an electron device having input and output electrodes, said device providing amplified signals at said output electrode in response to the application of signals to said input electrode, circuit means connected to said input and output electrodes including a regenerative feedback circuit coupling said output electrode to said input electrode for controlling the frequency of the oscillator by controlling the phase of signals fed back, said feedback circuit including a crystal series resonant at a predetermined frequency and a series resonant circuit connected in series with said crystal, reactance means having a reactance element and control means and with the effective value of said reactance element varying in accordance with a signal applied to said control means, said reactance element being connected in said series resonant circuit and tuning the same through a range of frequencies including said predetermined frequency to thereby vary the phase of signals fed back, said circuit means and said feedback circuit being constructed so that the frequency of oscillations is controlled substantially entirely by said feedback circuit, and means for applying a signal to said control means of said reactance means, whereby the frequency of the oscillator varies from said predetermined frequency in response to the signal applied to said reactance means to provide deviation of the oscillator frequency.

16. An electronic oscillator including in combination, an electron device having input and output electrodes, said device providing amplified signals at said output electrode in response to the application of signals to said input electrode, input and output circuits connected respectively to said input and output electrodes with one of said circuits being resonant at a predetermined frequency, a feedback circuit coupling said output circuit to said input circuit for controlling the frequency of the oscillator by control of the phase of signals fed back, said feedback circuit including a piezoelectric crystal unit series resonant at said predetermined frequency and a series resonant circuit in series with said crystal unit, a neutralizing inductor and a damping resistor connected across said crystal unit, said resonant circuit including reactance means having a reactance element and control means for controlling the effective value of said reactance element in accordance with a signal applied to said control means, said reactance element being connected in said series resonant circuit and tuning the same through a range of frequencies including said predetermined frequency to thereby vary the phase of signals fed back, said input and output circuits and said feedback circuit being constructed so that the frequency of oscillations is controlled substantially entirely by said feedback circuit, and means for applying signals to said control means whereby the frequency of said oscillator varies from said predetermined frequency to provide deviation of the oscillator frequency in accordance with the signal applied to said control means of said reactance means.

References Cited in the file of this patent

UNITED STATES PATENTS

| | | |
|---|---|---|
| 1,780,229 | Green | Nov. 4, 1930 |
| 1,955,471 | Pooler | Apr. 17, 1934 |
| 2,163,403 | Meacham | June 20, 1939 |
| 2,175,174 | Bessemer | Oct. 10, 1939 |
| 2,495,634 | Hepp | Jan. 24, 1950 |
| 2,541,650 | Hepp | Feb. 13, 1951 |
| 2,559,023 | McCoy | July 3, 1951 |
| 2,696,583 | Brown | Dec. 7, 1954 |
| 2,774,943 | Watson | Dec. 18, 1956 |

FOREIGN PATENTS

| | | |
|---|---|---|
| 671,194 | Great Britain | Apr. 30, 1952 |

OTHER REFERENCES

The Gerber Crystal Reactance System CQ, October 1948, page 37.